US006534984B2

(12) United States Patent
Westphal

(10) Patent No.: US 6,534,984 B2
(45) Date of Patent: Mar. 18, 2003

(54) ASYMMETRIC ARRANGEMENT OF PERMANENT-MAGNETIC ELEMENTS FOR A MAGNETIC RESONANCE APPARATUS

(75) Inventor: Michael Westphal, Offenbach (DE)

(73) Assignee: Bruker BioSpin GmbH, Rheinstetten (DE)

( * ) Notice: Subject to any disclaimer, the term of this patent is extended or adjusted under 35 U.S.C. 154(b) by 0 days.

(21) Appl. No.: 10/108,452

(22) Filed: Mar. 29, 2002

(65) Prior Publication Data

US 2003/0006772 A1 Jan. 9, 2003

(30) Foreign Application Priority Data

Apr. 7, 2001 (DE) .......................................... 101 17 595

(51) Int. Cl.[7] ................................................. H01F 5/00
(52) U.S. Cl. ...................................... 324/318; 324/309
(58) Field of Search ................................ 324/318, 309, 324/308, 307, 321; 128/653.5; 335/219

(56) References Cited

U.S. PATENT DOCUMENTS

| | | | |
|---|---|---|---|
| 4,689,591 A | | 8/1987 | MCDougall ................. 324/318 |
| 5,250,901 A | * | 10/1993 | Kaufman et al. ........... 324/318 |
| 5,959,454 A | | 9/1999 | Westphal .................... 324/318 |

* cited by examiner

Primary Examiner—Edward Lefkowitz
Assistant Examiner—Brij B. Shrivastav
(74) Attorney, Agent, or Firm—Paul Vincent

(57) ABSTRACT

A main field magnet arrangement for a one-sided magnet resonance device produces a homogeneous magnetic field B in a working volume (4). The working volume (4) and the main field magnet (1) are disposed on different sides of a plane E and the main field magnet (1) has a geometric shape which permits disposal of a radio frequency (RF) receiver coil system and optionally a gradient coil system on the same side of the plane E as the main field magnet (1). Field-generating elements of permanent-magnetic material form a radially outer part (2) and a radially inner part (3) relative to an axis A extending through the center of the working volume (4), wherein the surface, facing the working volume (4), of the radially inner part (3) is axially further spaced apart from the center of the working volume (4) than the surface of the radially outer part (2) facing the working volume (4), such that a depression (5) is formed in the radially inner part (3) in the axial direction. At least the radially inner part (3) of the field-generating elements is made from permanent-magnetic material, the axes of the prismatic rods forming a grid of lines having a grid constant a. The surfaces of the prismatic rods, facing the working volume (4), of the radially inner part (3) of the field-generating elements have different axial separations from the center of the working volume (4) which deviate from a rotationally-symmetrical distribution about the axis A, with the grid of lines extending in two main directions over at least four grid constants. Such an arrangement is particularly suited for use in a magnetic resonance tomography system for examining e.g. skin.

29 Claims, 9 Drawing Sheets

| 32 | 31 | 30 | 29 | 28 | 27 | 26 |
|----|----|----|----|----|----|----|
| 33 | 14 | 13 | 12 | 11 | 10 | 49 |
| 34 | 15 | 4  | 3  | 2  | 25 | 48 |
| 35 | 16 | 5  | 1  | 9  | 24 | 47 |
| 36 | 17 | 6  | 7  | 8  | 23 | 46 |
| 37 | 18 | 19 | 20 | 21 | 22 | 45 |
| 38 | 39 | 40 | 41 | 42 | 43 | 44 |

ASYMMETRIC ARRANGEMENT OF PERMANENT-MAGNETIC ELEMENTS FOR A MAGNETIC RESONANCE APPARATUS

This application claims Paris Convention priority of DE 101 17 595.7 filed Apr. 7, 2001 the complete disclosure of which is hereby incorporated by reference.

BACKGROUND OF THE INVENTION

The invention concerns a main field magnet arrangement in one-sided magnetic resonance devices for generating a homogeneous magnetic field B in a working volume, wherein the working volume and the main field magnet are disposed on different sides of a plane E and the main field magnet has a geometric shape which permits arrangement of a radio frequency (RF) receiver coil system and optionally a gradient coil system on the same side of the plane E as the main field magnet wherein field-generating elements of permanent-magnetic material are provided which are magnetized in the same sense and in the direction of the magnetic field B in the working volume and which have a radially outer part and a radially inner part relative to an axis A extending through the center of the working volume, wherein the surface, facing the working volume, of the radially inner part is axially spaced further apart from the center of the working volume than the surface, facing the working volume, of the radially outer part, with a depression being formed in the axial direction in the radially inner part.

An arrangement of this type is e.g. known from U.S. Pat. No. 5,959,454.

An appropriate mathematical description of the spatial dependence of the magnetic induction $B(\rho,\theta,\phi)$ as a function of the spherical coordinates $\rho,\theta,\phi$ ($\rho$: radius, $\theta$: polar angle relative to the axis, $\phi$: azimuthal angle) about a point in the center of the working volume is given by the expansion according to spherical harmonic functions:

$$B(\rho, \theta, \phi) = \sum_{l=0}^{\infty} \sum_{m=-l}^{+l} C_{l,m} \rho^l P_{l,m}(\cos \theta)(\cos m\phi + i \sin m\phi)$$

$P_{l,m}(\cos \theta)$: associated Legendre polynomial of degree l and order m, $C_{l,m}$: Amplitude, $i^2=-1$ The amplitudes $C_{l,m}$ are complex numbers. Since the magnetic induction B is real, the amplitudes $C_{l,m}$ with identical l and oppositely equal m are complex conjugates of each other. For magnets which should generate as homogeneous a magnetic field in a working volume as possible, the term with l=m=0 is the only desired term since it describes an ideally homogeneous magnetic field. All other terms are disturbance terms which impair homogeneity. In the geometrical design of main field magnets for generating homogeneous magnetic fields, one therefore tries to eliminate as many disturbance terms of a degree l>0 as possible up to as large a value $l_0$ as possible through optimization of the geometric arrangement of the main field magnet. In these cases, the dependence of magnetic induction B along any straight line through the center of the working volume is given by superposition of the desired constant term with parabolas of order $>l_0+1$. The latter provide only negligible contributions to the magnetic field proximate the origin which is therefore homogeneous through a limited working volume, and is suitable for magnetic resonance method examinations. For rotationally symmetric magnet arrangements, the magnetic field is also rotationally symmetric such that for arrangements of this type all terms with m unequal 0 theoretically disappear. The second summation completely vanishes and the number of possible disturbance terms of amplitudes $C_{l,m}$ to be compensated when designing the arrangement, is considerably reduced. For magnet arrangements which are additionally mirror-symmetrical in the axial direction relative to the center of the working volume, all disturbance terms disappear with even-numbered degree l. In these cases, the geometric design of the main field magnet must eliminate only very few, e.g. five, disturbance terms to obtain a theoretically very large working volume. For these reasons, commercial main field magnets for magnetic resonance devices according to current prior art usually have a mirror symmetry in the axial direction relative to the center of the working volume and are always rotationally symmetric. Deviations from pure rotational symmetry exist, if at all, due to magnetic components of the magnet arrangement which are far away from the respective working volume, such as magnetic yokes of iron in magnet arrangements having iron shielding. The components of magnet arrangements which are close to the working volume are in any case rotationally symmetric. In practice, none of the magnet arrangements mentioned herein is suited for generating sufficiently homogeneous magnetic fields on its own since unavoidable tolerances during production generate relatively small disturbance terms of a low degree l and low order l which are, however, still inadmissibly large for the application and which therefore must be compensated for with a suitable additional magnet arrangement, the shim system, which can be precisely set.

U.S. Pat. No. 4,689,591 describes arrangements of magnetic field generators, mainly magnet coils which are generally rotationally symmetric relative to an axis, however, not symmetrical in the direction of the axis. In this reference, permanent magnets are also used as magnetic field generators which are preferably rod-shaped and are magnetized in the direction of their longitudinal axes. A concrete design of such magnet arrangements is not disclosed.

U.S. Pat. No. 5,959,454 discusses a class of main field magnets which consists exclusively or principally of permanent-magnetic components which are exclusively rotationally-symmetrical about a common axis. The magnet arrangements according to U.S. Pat. No. 5,959,454 comprise a radially outer ring of permanent magnetic material which is magnetized in the direction of the axis. A rotationally-symmetrical insert of permanent-magnetic material, which is also magnetized in the same direction as the outer ring, is disposed inside the outer ring. In the most simple form, the insert also comprises one or more nested rings and possibly an full inner cylinder. The particularly advantageous property of these arrangements consists in that the insert represents a depression on the side of the magnet arrangement facing the working volume which can be sufficiently large that a relatively large working volume with sufficiently homogeneous and relatively strong magnetic field becomes possible.

Moreover, there is sufficient space in the depression for receiving an actively shielded one-sided gradient coil system and an RF coil. The magnetic field in the working volume of these arrangements has an axial orientation (z direction). The magnetic induction in the working volume in the embodiment of U.S. Pat. No. 5,959,454 is approximately 14% of the magnetic remanence polarization of the magnetic material. With the magnetic material NdFeB having a remanence polarization of 1.3 T, one obtains an induction of 0.18 T which is within the usual range of commercial magnetic resonance devices.

The magnet arrangements according to U.S. Pat. No. 5,959,454 are rotationally symmetrical but are designed for applications where mirror-symmetry relative to the center of the working volume is impossible. In the embodiments disclosed therein, all disturbance terms of the order m=0 disappear due to the rotational symmetry and all disturbance terms of the degrees 1, 2, 3, 4 disappear due to the further geometrical design. However, disadvantageously, the exclusively permanent-magnetic components must be rotationally symmetric. NdFeB, which is preferably used for such magnets, is not suited for rotationally-symmetric shaping since it cannot be processed by turning on the lathe. Grinding into shape is the preferred processing method for this material. Although grinding into a cylindrical shape is possible, flat surfaces are nevertheless preferable. A further disadvantage consists in that the shim system must be accommodated in the depression thereby reducing the space for the gradient coil system and the RF coil. Although only little magnetic material is needed for the shim system, a relatively large amount of space is nevertheless required for the mechanical holding device of the magnetic material for the shim system. Disposal of the shim system behind the magnet arrangement, (see U.S. Pat. No. 5,959,454) is not suitable in practice, since the large separation causes the magnetic fields in the working volume which are produced by the shim system to be too weak. Although realization of the overall system of main field magnets, gradient coil system, shim system and RF coil with the shim system accommodated in the depression of the main field magnet is possible, more space in the depression would be desirable.

In contrast thereto, it is the object of the invention to further improve a main field magnet arrangement of the above-mentioned kind such that components of permanent magnetic material with flat ground surfaces can be exclusively used for producing the main field magnet. A further object of the invention consists in further reducing the required space for a shim system disposed in the depression.

SUMMARY OF THE INVENTION

This object is achieved in accordance with the invention in a manner which is as simple as it is effective in that at least the radially inner part of the field-generating elements is formed of parallel adjacent prismatic rods of permanent-magnetic material, with the axes of the prismatic rods forming a line grid of grid constant a, wherein the surfaces of the prismatic rods of the radially inner part of the field-generating elements, facing the working volume, have different, axial separations from the center of the working volume which, in particular, are not rotationally-symmetrically distributed about the axis A extending through the center of the working volume, the line grid extending in both main directions over at least four grid constants.

It is thereby surprisingly possible to generate magnetic fields of homogeneity comparable to that of U.S. Pat. No. 5,959,454 in a working volume of comparable position and size, despite the lack of rotational symmetry and with magnet arrangements having outer dimensions of similar size. All disturbance terms of the magnetic field characterized by spherical harmonic functions with a degree l<5 can, in particular, be eliminated including the disturbance terms of order m=4 which are fundamentally associated with the four-fold symmetry of the inner part of the magnet arrangement. It is thereby unnecessary for e.g. individual rods to project so far into the depression as to impair accommodation of a gradient coil system and an RF coil. The field-generating elements of permanent-magnetic material advantageously generate at least 90%, preferably 99% of the homogeneous magnetic field B in the working volume.

If the main field magnet is part of a magnetic resonance (MR) tomography system, in particular a system for examining the skin, regions close to the surface, of bodies of any size can be examined using magnetic resonance methods, e.g. the skin of humans or animals. Examination of larger containers holding liquids is easy, since the specific properties of the liquid contained in the working volume is representative of all the liquid in the container.

In a preferred embodiment, the prismatic rods have the same polygonal cross-section. These rods facilitate generation of a homogeneous magnetic field and a uniform grid.

A particularly advantageous embodiment of the invention is characterized in that the prismatic rods have rectangular, preferably square cross-sections. This permits production of a particularly uniform grid. The grid constant a can be adjusted via the dimensions of the square rods. A further advantage of the design of the radially inner part of the permanent magnet arrangement of square prisms whose axes form a square line grid consists in that in this fashion, a high cross-sectional fraction vqi of the permanent-magnetic material of the radially inner part of the magnet arrangement of up to 100% is possible. This permits magnet arrangements with particularly large magnetic field strengths in the working volume and provides a particularly large amount of space in the depression. Prisms with square or rectangular cross-section can be produced in a simpler and more precise fashion than prisms having other cross-sections. The radially inner part is also particularly easy to produce. The use of prisms with square cross-section produces a radially inner part with a maximum four-fold symmetry which can principally generate disturbance terms of the order m=4. Nevertheless, such arrangements can still eliminate all disturbance terms up to and including degree l=4.

In an alternative embodiment of the invention, the prismatic rods have cross-sections of triangular shape, preferably with equal sides. This permits replacement of a square by two triangles with one axis each to improve the adjustability of the system.

In an alternative advantageous embodiment, the prismatic rods have cross-sections of a hexagonal shape, preferably with equal sides.

In an advantageous embodiment of the invention, at least groups of prismatic rods, preferably all prismatic rods, have identical construction. The square prisms of permanent-magnetic material in the radially inner part of the magnet arrangement can have the same length. This is advantageous in that the production of these prisms is particularly inexpensive owing to their uniform shape.

It is particularly advantageous if the radially outer part of the field-generating elements is also formed of parallel adjacent prismatic rods of permanent-magnetic material. Field homogenization in the working volume can be further improved with this measure.

In a preferred embodiment, the radially outer part of the field-generating elements is designed like a ring with square outer and inner ring cross-section. In this fashion, the radially outer part can be produced precisely and inexpensively by compression molding, sintering and grinding. None of the field-generating parts of the magnetic arrangement of this embodiment are rotationally-symmetric. However, a homogeneous magnetic field can still be produced in the working volume. In particular, it is possible to eliminate all disturbance terms of the magnetic field characterized by spherical harmonic functions with a degree l<5, even the disturbance term of the order m=4 which is fundamentally associated with the merely four-fold symmetry of the overall magnet arrangement and without e.g. individual rods projecting so far into the depression so as to impair use of the depression for accommodating a gradient coil system and an RF coil.

In a further development, the radially outer part of the field-generating elements is formed from one piece. It is possible to produce the radially outer part of this design e.g. by gluing together rods of square or cuboid cross-section.

In a preferred embodiment of the invention, the cross-sectional fraction vqi of the overall cross-sectional area of the radially inner part of the field-generating elements which is filled with the permanent magnetic material is at least 0.65. This avoids the need for individual square prisms to project deeply into the depression on the side of the magnet arrangement facing the working volume to reduce the space for receiving a gradient coil system and an RF coil in that depression.

In a preferred embodiment of the invention, the radially inner part of the field-generating elements is separated from the radially outer part. The radially inner part of the magnet arrangement therefore requires less of the expensive permanent-magnetic material with otherwise large magnetic field strength and homogeneity of the magnetic field in the working volume.

In an advantageous further development, the radial region between the radially inner part and the radially outer part of the field-generating elements is filled with a non-magnetic filler.

In a preferred embodiment of the invention, the number of prismatic rods of the radially inner part of the field-generating elements is between 37 and 81, preferably between 45 and 49. In this fashion, the number of prisms can be kept sufficiently small to make the production of the radially inner part of the magnet arrangement simple and therefore inexpensive. On the other hand, the number of prisms is large enough to obtain a particularly large spatial extent of the working volume of homogeneous magnetic field through selection of the different separations of the surfaces of the respective prisms facing the working volume from the center of the working volume. All the disturbance terms of the magnetic field characterized by a degree l<5 for the spherical harmonic functions can e.g. be eliminated even the disturbance term of the order m=4 which is fundamentally associated with the merely four-fold symmetry of the overall magnet arrangement.

In a particularly preferred embodiment of the invention, the quotient vzi of the axial separation between the surfaces, facing the working volume, of the radially inner part of the field-generating elements and the center of the working volume and the radial separation ri of the axis A extending through the center of the working volume to the next radial inner border of the radially outer part of the field-generating elements is at least 0.4. In this fashion, a depression with a relatively large amount of space is produced for receiving a gradient coil system and an RF coil and a relatively large spatial extension of the working volume with homogeneous magnetic field is possible.

In particular, this theoretically permits elimination of all disturbance terms of the magnetic field characterized by spherical harmonic functions of degree l<5, even the disturbance term of the order m=4 which is fundamentally associated with the merely four-fold symmetry of the overall magnet arrangement.

A further embodiment of the invention is characterized in that the quotient vza of the axial separation of the surfaces, facing the working volume, of the radially outer part of the field-generating elements to the center of the working volume and the radial separation ri between the axis A extending through the center of the working volume and the nearest radially inner border of the radially outer part of the field-generating elements is between 0.05 and 0.3. This guarantees that the working volume has a relatively large separation from the magnet arrangement and that the magnetic field in the working volume is sufficiently strong and homogeneous for magnetic resonance examinations. In this fashion, all disturbance terms of the magnetic field which are characterized by spherical harmonic functions of degree l<5 can be theoretically eliminated, even the disturbance term of the order m=4 which is fundamentally associated with the merely four-fold symmetry of the overall magnet arrangement.

It is particularly preferred when the quotient vra between the radial separation ra of the axis A extending through the center of the working volume to the next radially outer border of the radially outer part of the field-generating elements and the radial separation ri of the axis A to the next radial inner border of the radially outer part of the field-generating elements is between 1.5 and 2.5. This permits generation of particularly homogeneous and particularly strong magnetic fields in the working volume.

In a preferred embodiment of the invention, the quotient vl between the axial length L and the radial separation ri of the axis A extending through the center of the working volume to the next radial inner border of the radially outer part of the field-generating elements is between 1.5 and 3. This permits generation of particularly homogeneous and particularly strong magnetic fields in the working volume.

In a particularly preferred embodiment, at least part of the prismatic rods of permanent magnetic material of the radially inner part of the field-generating elements is joined to form a unit with the radially outer part and optionally with non-magnetic filler in a region between the inner and outer part. This produces a body defining axially extending channels in the region of the movable prismatic rods having e.g. square cross-sections, which can serve as guidances for the axially movable prismatic rods.

Advantageously, at least part of the prismatic rods of permanent magnetic material of the radially inner part of the field-generating elements is movable in the axial direction and the axial position of these rods can be adjusted and fixed by adjusting means. Adjustment of the axial position of several prisms permits compensation of deviations of the spatial dependence of the magnetic field in the working volume from the desired homogeneous dependence due e.g. to production tolerances.

When the adjustment means are disposed on the side of the magnet arrangement facing away from the working volume, no additional shim system is required in the depression of the magnet arrangement facing the working volume, for homogenizing the magnetic field thereby providing more space for a gradient coil system and an RF coil.

In a preferred embodiment of the invention, a magnetic field mirror, in particular a mirror plate of soft-magnetic material, is provided on the side of the magnet arrangement facing away from the working volume. While substantially maintaining the geometric shape of the magnet arrangement on its side facing the working volume, the axial length of the magnet arrangement can thereby be shortened i.e. to approximately half the length to thereby approximately halve the material costs of the relatively expensive permanent magnetic material without impairing the magnetic field strength and the homogeneity of the magnetic field in the working volume. Moreover, the undesired magnetic stray field on the side of the magnet arrangement facing away from the working volume is strongly reduced.

In an advantageous embodiment of the inventive main field magnet arrangement, the prismatic rods and optionally additional field-generating elements of the magnet arrangement are made from a permanent magnetic material having high magnetic hardness, wherein, when applying a demagnetizing magnetic field H of a strength at which induction in the magnetic material vanishes, the magnetization M(H) in the magnetized state is reduced by less than 20% relative to the saturation magnetization $M_r$. This assures that the permanent-magnetic material of the magnet arrangement will not demagnetize in its own magnetic field.

It is particularly preferred when the permanent-magnetic material contains a NdFeB alloy. This permits generation of particularly high magnetic field strengths in the working volume. Moreover, the inventive geometric shape of the magnet arrangement and its components can be produced precisely and inexpensively with this material.

The object in accordance with the invention is also achieved with a method for producing a magnet arrangement wherein the prismatic rods are produced by compression molding, sintering and precision grinding. In particular, prismatic rods of NdFeB can be produced with high precision and at little cost.

In an advantageous method variant, the prismatic rods of the radially outer part of the magnet arrangement are glued in parallel.

Further advantages can be extracted from the drawing and the description. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and is explained in more detail by means of embodiments.

BRIEF DESCRIPTION OF THE DRAWING

FIG. 6 shows a schematic cross-section through the radially inner part of an inventive magnet arrangement perpendicular to the axis;

DESCRIPTION OF THE PREFERRED EMBODIMENT

Figure 1:
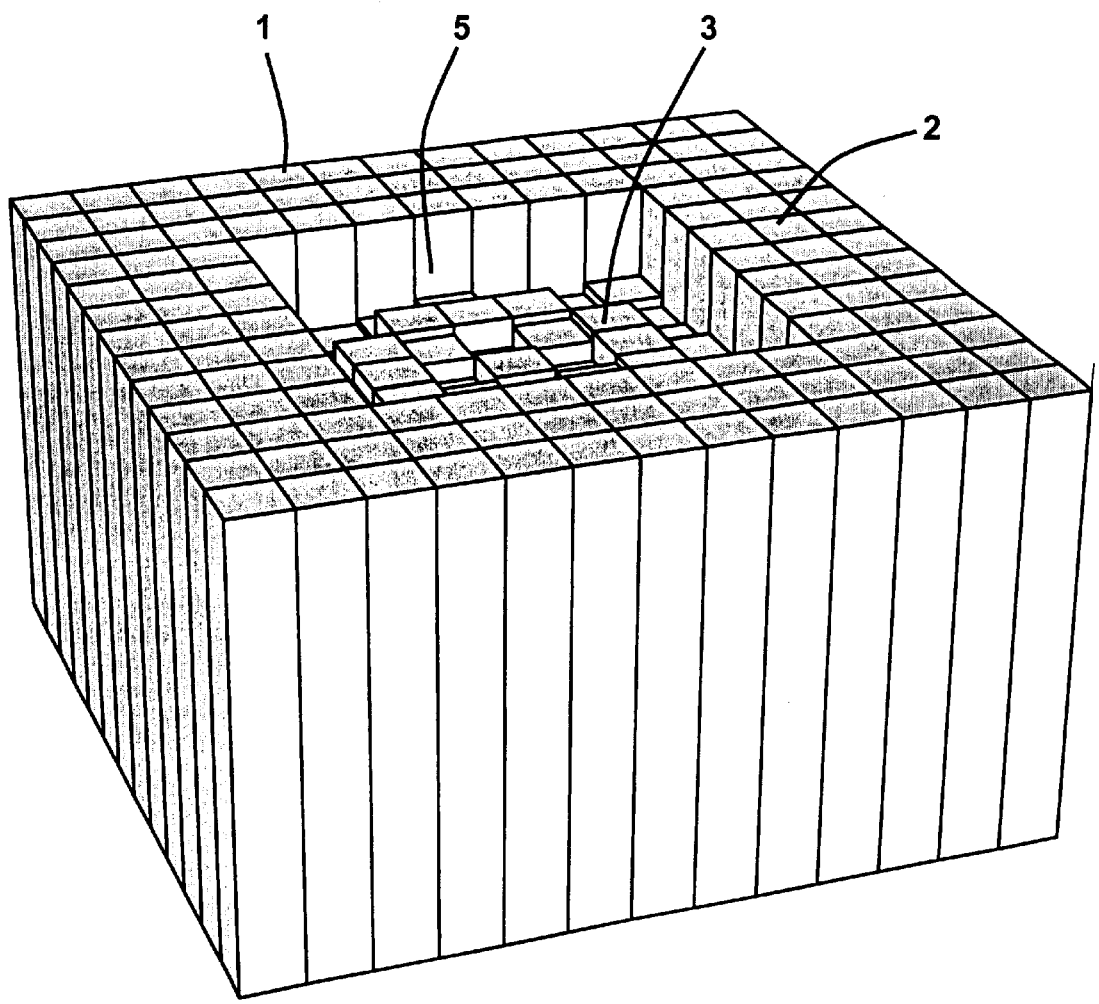
FIG. 1 shows a perspective view of an inventive magnet arrangement.

FIG. 1 shows an embodiment of an inventive magnet arrangement 1 with a radially outer part 2 and a radially inner part 3, wherein a depression 5 is formed in the radially outer part 2. A gradient coil system and an RF coil can be disposed in this depression 5. The radially inner part 3 consists of square prisms of permanent magnetic material. The entire magnet arrangement can be made from structural members with flat surfaces which are at right angles to each other which can be produced with high precision in a particularly simple and inexpensive manner e.g. with the preferred permanent magnetic material NdFeB.

Figure 2:
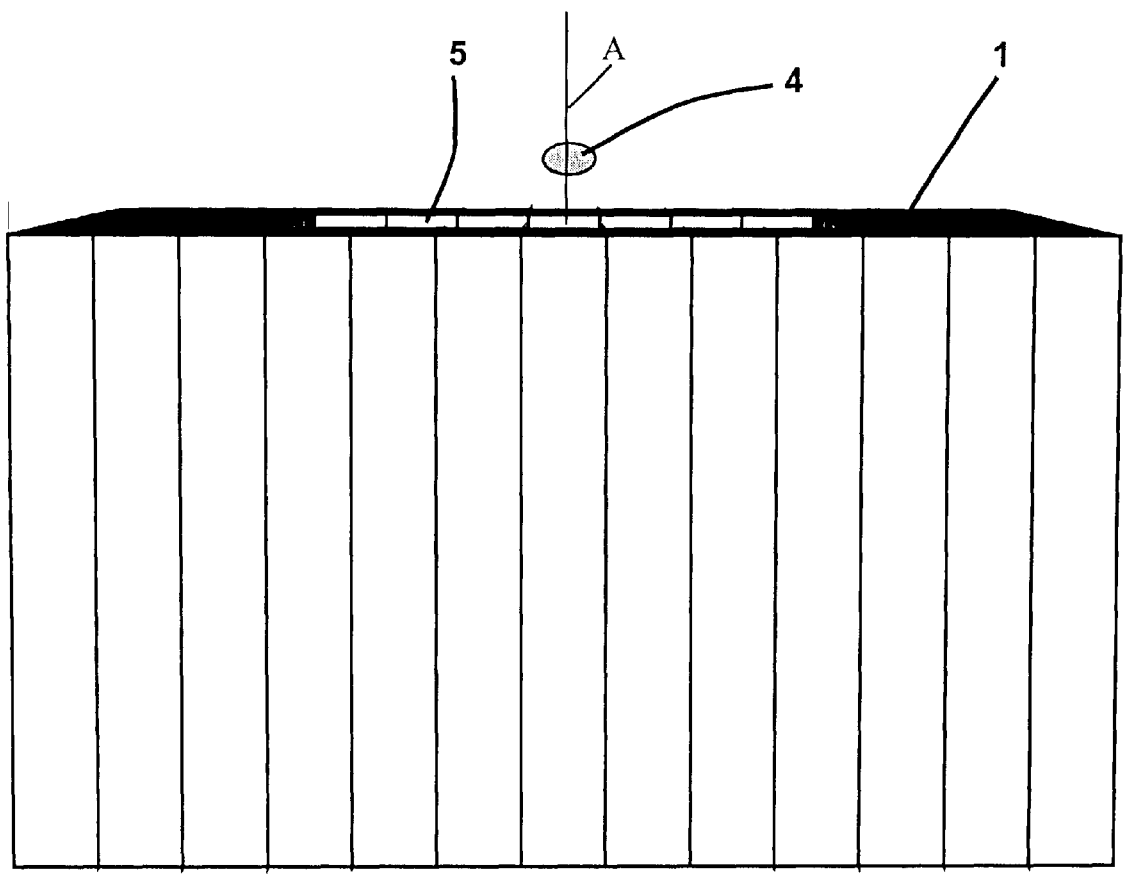
FIG. 2 shows a side view of an inventive magnet arrangement.

The side view of the same magnet arrangement 1 shown in FIG. 2 illustrates the working volume 4 which is suitable for magnetic resonance examinations. The relative deviation of magnetic induction B from its central value is theoretically smaller than +/−10 ppm (ppm: "parts per million"). The working volume 4 is located in FIG. 2 above, i.e. completely outside of the magnet arrangement 1. The magnet arrangement 1 can therefore be used to examine the regions close to the surface of bodies of any size using magnetic resonance methods, e.g. the skin of humans or animals. Larger containers holding liquids can also be examined when the specific properties of the portion of the liquid contained in the working volume 4 are representative of the overall liquid enclosed in the container. In such cases, a gradient coil system is not usually required. The additional free space in the depression 5 can be used for a larger RF coil. The strength of the magnetic induction in the working volume 4 can typically be 0.1 to 0.2 times the remanence polarization in the permanent magnetic material, which, in turn, is approximately 1.3 Tesla for the preferred NdFeB compounds of the usual quality. A working volume 4 with the relative size shown herein is obtained with the geometric design of the magnet arrangement 1 selected to eliminate all disturbance terms in an expansion of the magnetic field according to spherical harmonic functions, up to and including the degree l=4. This is achieved in the simplest fashion through appropriate adjustment of the axial positions of all square prisms (e.g. 6a to 6c and 7a to 7c in FIG. 3) in the radially inner part 3 of the magnet arrangement 1 (see FIG. 3).

Figure 3:
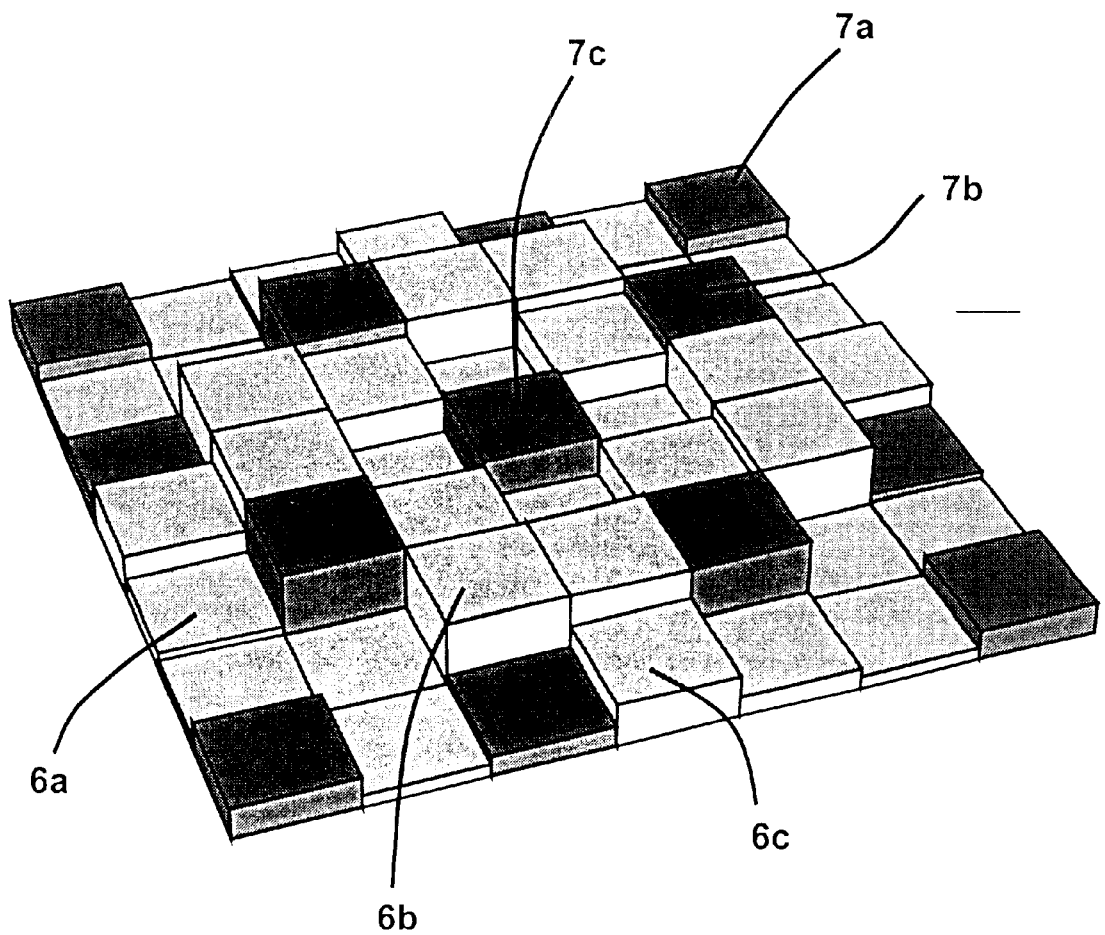
FIG. 3 shows a perspective view of the surface, facing the working volume, of the radially inner part of the arrangement shown in FIG. 1.

FIG. 3 shows the ends, facing the working volume 2, of the square prisms of a magnet arrangement 1 with homogeneous magnetic field in the working volume 4. A partial amount of the square prisms is thereby shaded dark, e.g. the prisms 7a, 7b, 7c. If these darkly shaded square prisms are disposed to be axially movable by means of adjustment means (not shown), deviations of the spatial dependence of the magnetic field strength or induction from the desired homogeneous dependence which result in real magnet arrangements due to geometrical tolerances and tolerances in the values of remanence polarization in the different square prisms can be compensated through suitable adjustment of the axial position of these square prisms. The adjustment means are appropriately disposed on the side of the magnet arrangement 1 facing away from the working volume 4 and are, in the simplest case, adjusting screws which are anchored to a mounting plate, together with the radially outer part 2 of the magnet arrangement 1. In the example shown in FIG. 3, the side surfaces of the lightly shaded immovable square prisms can be joined to each other and to the radially outer part 3 e.g. by gluing. This produces a body which contains, in the region of the dark shaded square prisms, axially oriented channels with square cross-sections which can serve as guidances for the dark shaded axially movable square prisms. The cross-section of the dark shaded axially movable square prisms must not be completely filled with permanent magnetic material, rather can e.g. have a cross-sectional fraction of between 70 and 80%. The remaining free cross-sectional fraction can be used for installing mechanical guidances. Other distributions of fixed and axially movable square prisms are also possible. It is to be noted that, for reasons of clarity, FIG. 3 only shows the upper ends of the square prisms. The axial lengths of the square prisms are in fact considerably larger: e.g. 8 times their transverse dimensions.

Figure 4:
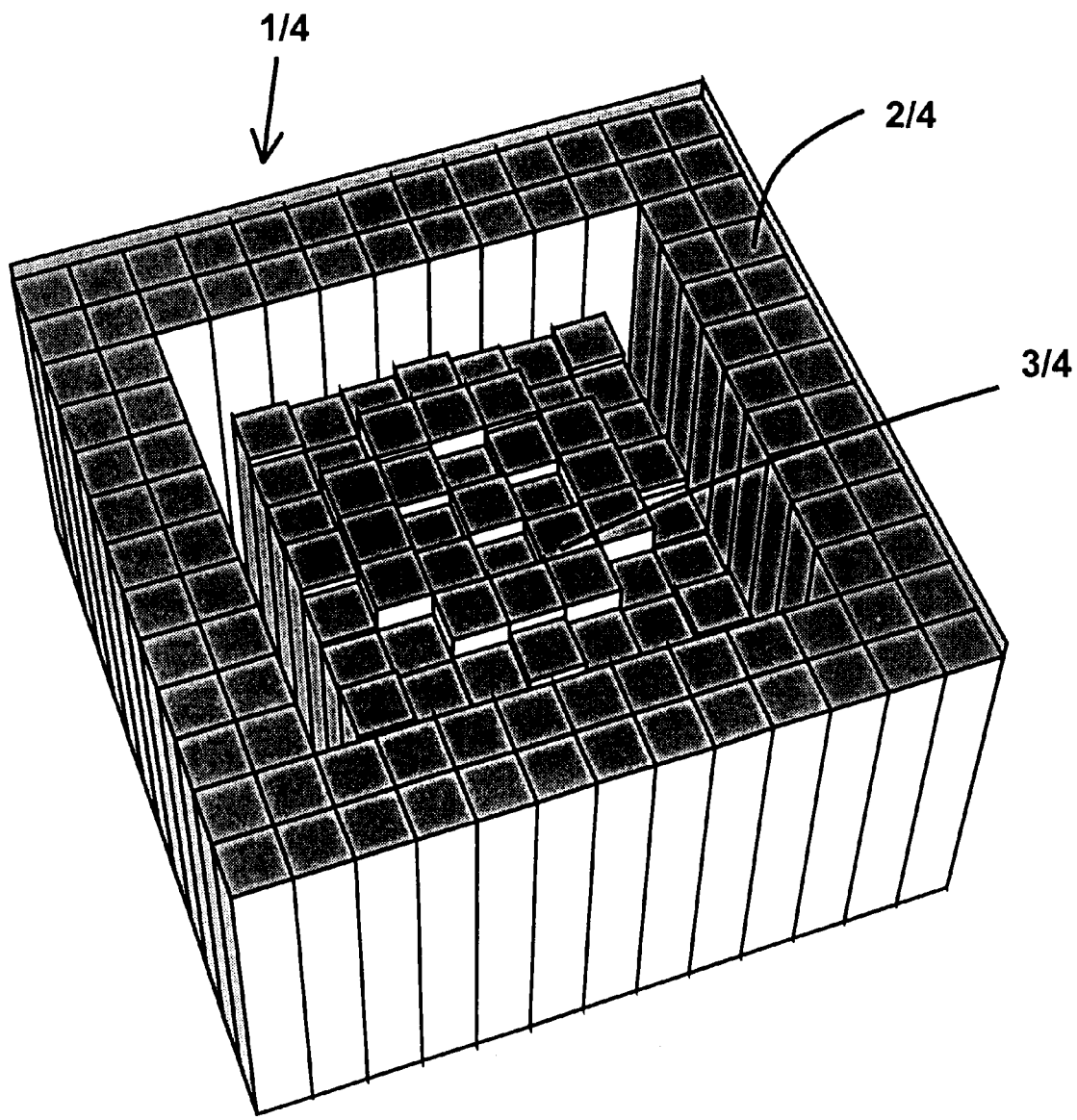
FIG. 4 shows a perspective view of an inventive magnet arrangement.

FIG. 4 shows another embodiment of a magnet arrangement 1/4 wherein the radially inner part 3/4 is separated from the radially outer part 2/4.

Figure 5:
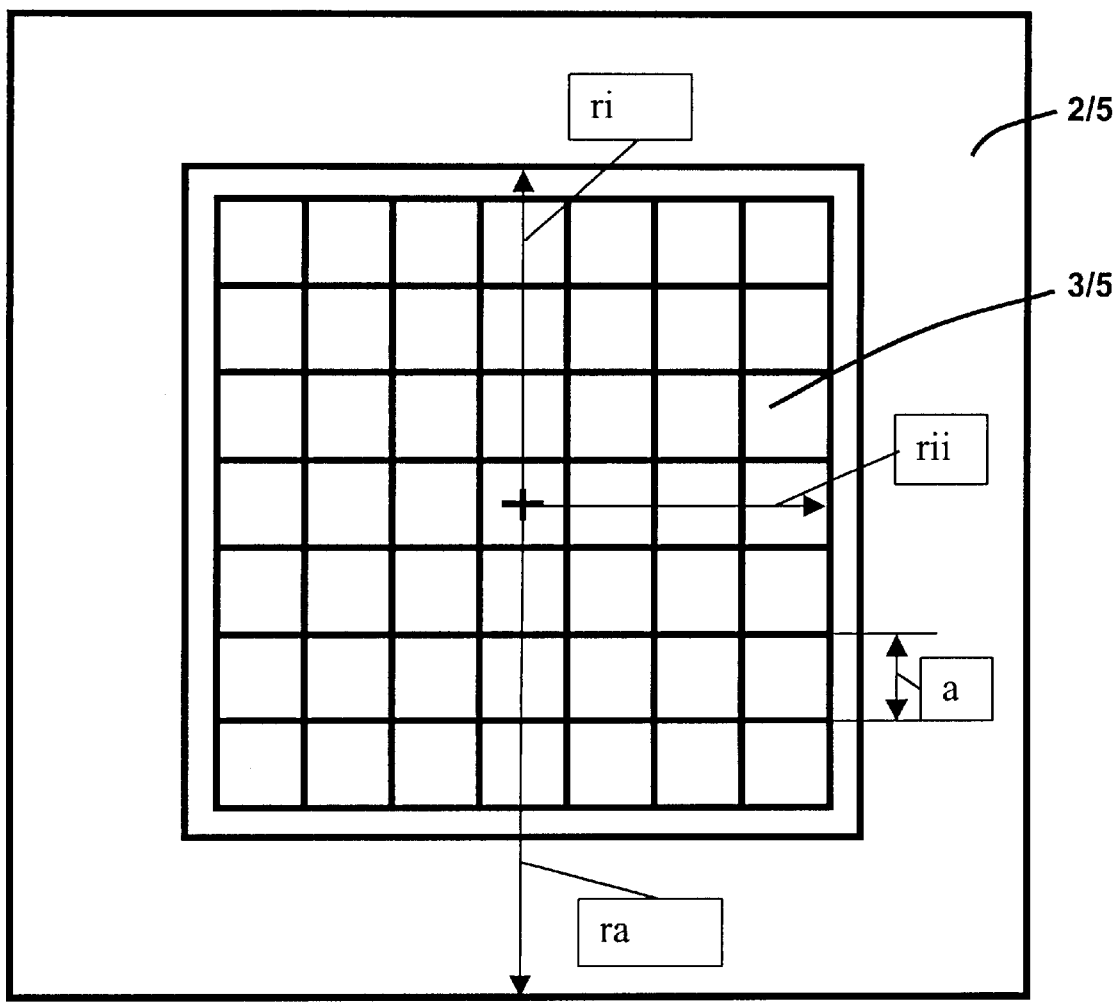
FIG. 5 shows a schematic cross-section through an inventive magnet arrangement perpendicular to the axis.

FIG. 5 shows a cross-section of a magnet arrangement according to FIG. 4, perpendicular to the axis. The radially outer part 2/5 has an outer edge length 2 ra and an inner edge length 2 ri. The radially inner part 3/5 has an edge length 2 rii, wherein rii is smaller than ri and the radially inner part 3/5 is therefore separated from the radially outer part 2/5 (as in the magnet arrangement shown in FIG. 4). The grid constant a of the square line grid on which the axes of the square prisms are disposed is also shown.

FIG. 6 shows a cross-section, perpendicular to the axis, through the radially inner part 3/6 of a magnet arrangement. The individual square prisms are provided with sequential numbering for characterization which will be used in the diagrams of FIGS. 7 and 8. The central prism is given the number 1. The prisms disposed about the central prism have the numbers 2 to 9, in an anti-clockwise circulating direction, with the prism having the number 2 being disposed in the direction of a diagonal, viewed from the central prism. The prisms disposed further outside are numbered accordingly. As in all other embodiments, there are 49 prisms. This number is sufficiently large to solve all mentioned objects which are to be achieved within the scope of this invention. It is usually possible to omit the prisms in the corners having the numbers 26, 32, 38, 44 and the adjacent prisms with the numbers 49, 27, 31, 33, 37, 39, 43, 45 of the radially inner part of a magnet arrangement without causing any problems.

Figure 7:
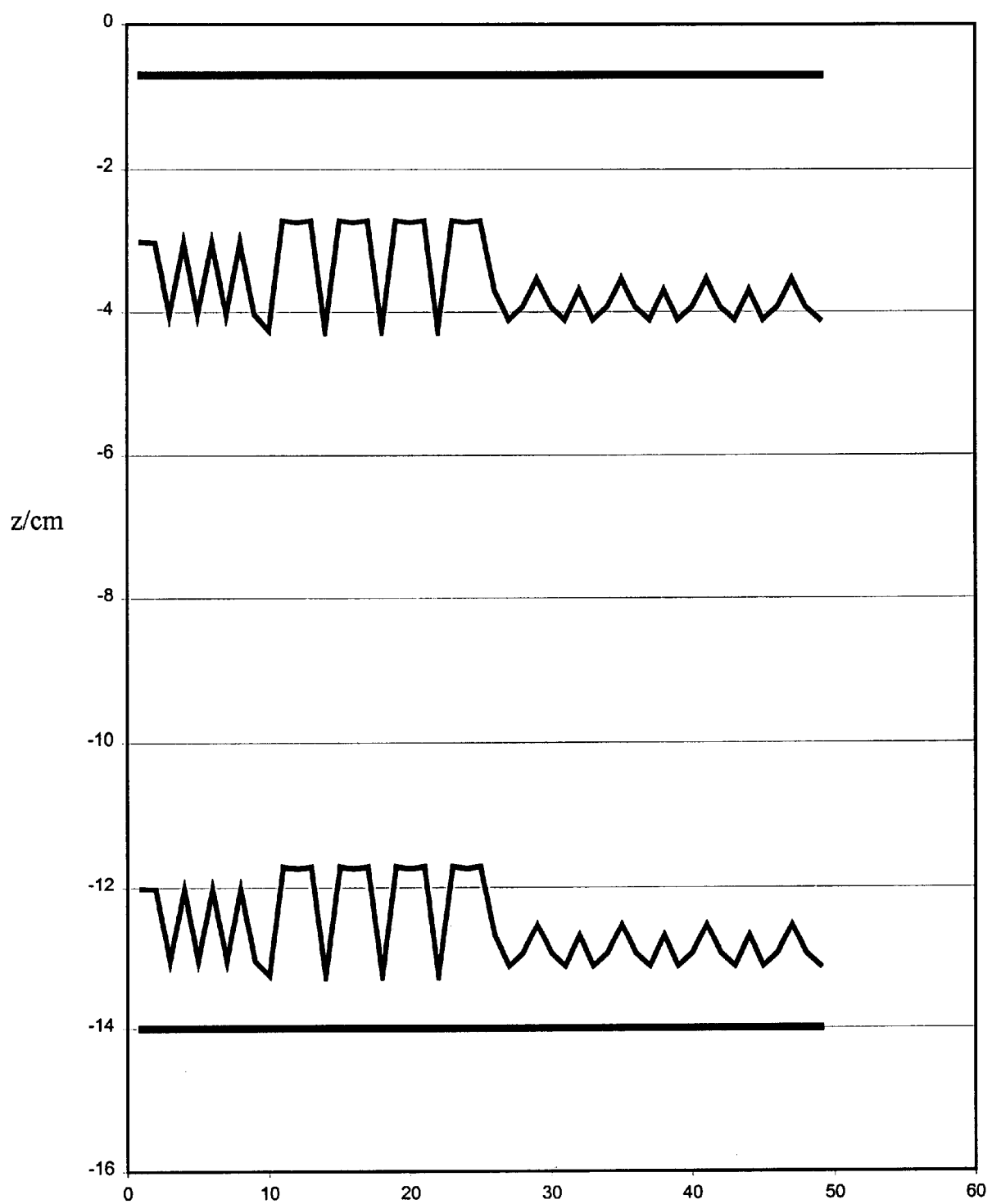
FIG. 7 shows a diagram, illustrating the calculated axial positions of the surfaces facing the working volume and facing away from the working volume of the different components of a special embodiment of an inventive magnet arrangement.

The diagram in FIG. 7 combines numerous details of a calculated example. In this calculated example:

rii=ri=5.4 cm, ra=10.6 cm

The ordinate z in the diagram defines the axial end positions of all components of the magnet arrangement. The center of the working volume is thereby at z=0. The upper line shows the axial position of the end facing the working volume of the radially outer part of the basic magnet arrangement which is at z=−0.7 cm. The lower line indicates the axial position of the end facing away from the working volume of the radially outer part of the magnet arrangement at z=−14 cm. The axial extension L of the radially outer part is thus 13.3 cm. The two intermediate lines show the axial positions of the ends, facing the working volume or facing away from the working volume, of the square prisms in the radially inner part of the magnet arrangement in the order of their numbering (1 to 49, see FIG. 6) which is plotted on the abscissa. All square prisms have a uniform axial length of 9.5 cm, which corresponds to the separation between the two lines. Each prism has an edge length of (2×5.4 cm)/7=1.5428 cm. The ends of the square prisms facing the working volume extend towards the center of the working volume up to a separation of 2.72 cm. This is a particularly important feature and should be as large as possible to ensure that the depression of the magnet arrangement offers ample space for receiving further components such as gradient coils and RF coils. The quantitative axial arrangement of the square prisms shown herein is very similar to the perspective view of FIG. 3. This magnet arrangement is characterized by the relative characteristic geometric numbers vza=0.13, vzi=0.504, vra=1.96 and vl=2.46. The spatial dependence of the magnetic induction B in the region of the working volume can be characterized by the coefficients $C_{l,m}$, of an expansion of the induction in spherical harmonic functions as listed in table 1.

| l/m | 0 | +/−1 | +/−2 | +/−3 | +/−4 | +/−5 | +/−6 |
|---|---|---|---|---|---|---|---|
| 0 | 2059.2 | — | — | — | — | — | — |
| 1 | 0 | 0 | — | — | — | — | — |
| 2 | 0 | 0 | 0 | — | — | — | — |
| 3 | 0 | 0 | 0 | 0 | — | — | — |
| 4 | 0 | 0 | 0 | 0 | 0 | — | — |
| 5 | −1.48 | 0 | 0 | 0 | −0.000327 | 0 | — |
| 6 | 1.08 | 0 | 0 | 0 | 0.000116 | 0 | 0 |

Table 1: Real parts of the coefficients $C_{l,m}$ of the expansion according to spherical harmonic functions of the magnetic induction of a magnet arrangement with the radial dimensions rii=5.4 cm, ri=5.4 cm, ra=10.6 cm with vqi=1 and the axial dimensions stated in FIG. 7 and a homogeneous remanence polarization of 13000 Gauss in Gauss/cm$^l$ (10000 Gauss=1 Tesla). The imaginary parts of the coefficients vanish identically. The azimuthal angle φ used implicitly for the calculation of the coefficients is measured from a surface diagonal of the square arrangement.

Figure 8:
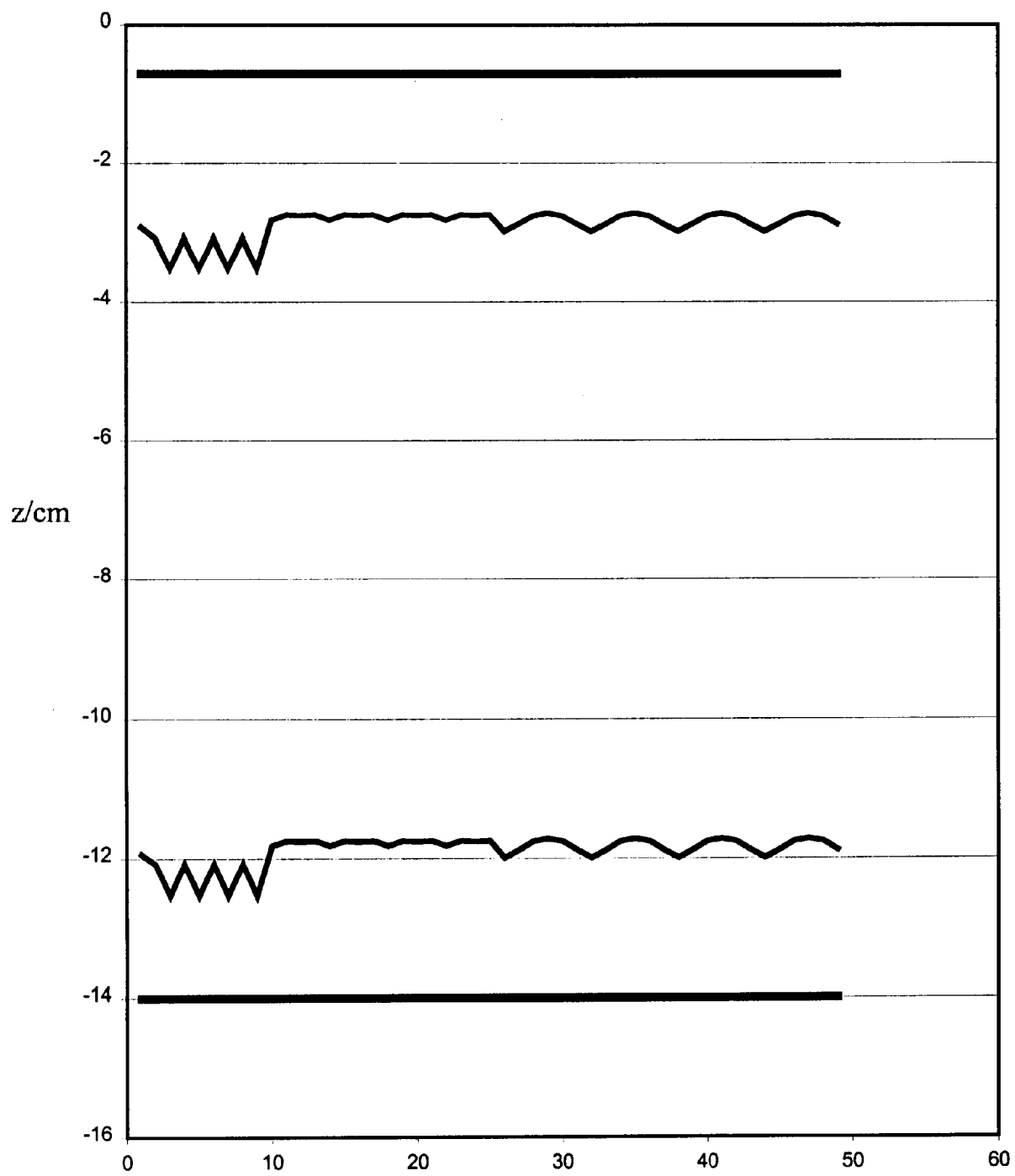
FIG. 8 shows a diagram of the calculated axial positions of the surfaces, facing the working volume and facing away from the working volume, of the different components of another special embodiment of an inventive magnet arrangement.

The diagram of FIG. 8 likewise shows the axial distribution of all components of another magnet arrangement, wherein, in contrast to the example of FIG. 7, only the dimension rii, half the length of the edge of the radially inner part of the arrangement, is reduced to rii=4.7 cm to thereby separate the radially inner and radially outer parts. All other geometric parameters are the same. The length of the edges of the square prisms in the radially inner part was reduced with (2×4.7 cm)/7=1.343 cm. The diagram of FIG. 8 shows that the axial positions of the square prisms in the radially inner part of the magnet arrangement fluctuate considerably less than in the arrangement of FIG. 7. The ends of the square prisms facing the working volume also extend in the direction of the center of the working volume to a separation of 2.72 cm therefrom. All relative geometric characteristic numbers vzi, vza, vra, vl remain absolutely unchanged.

The volume of the permanent-magnetic material is 5266 cm$^3$ and therefore smaller than that of the arrangement of FIG. 7 (5534 cm$^3$). Analogously to table 1, table 2 shows the parameters of magnetic induction in the working volume of the magnet arrangement.

| l/m | 0 | +/−1 | +/−2 | +/−3 | +/−4 | +/−5 | +/−6 |
|---|---|---|---|---|---|---|---|
| 0 | 1971.3 | — | — | — | — | — | — |
| 1 | 0 | 0 | — | — | — | — | — |
| 2 | 0 | 0 | 0 | — | — | — | — |
| 3 | 0 | 0 | 0 | 0 | — | — | — |

-continued

| l/m | 0 | +/−1 | +/−2 | +/−3 | +/−4 | +/−5 | +/−6 |
|---|---|---|---|---|---|---|---|
| 4 | 0 | 0 | 0 | 0 | 0 | — | — |
| 5 | −1.44 | 0 | 0 | 0 | −0.000044 | 0 | — |
| 6 | 1.08 | 0 | 0 | 0 | 0.0000203 | 0 | 0 |

Table 2: Real parts of the coefficients $C_{l,m}$ of the expansion according to spherical harmonic functions of magnetic induction of a magnet arrangement with the radial dimensions rii=4.7 cm, ri=5.4 cm, ra=10.6 cm with vqi=1 and the axial dimensions stated in FIG. 8 and a homogeneous remanence polarization of 13000 Gauss in Gauss/cm$^l$ (10000 Gauss=1 Tesla). The imaginary parts of the coefficients vanish identically. The azimuthal angle φ which is implicitly used for the calculation of the coefficients is measured from a surface diagonal of the square arrangement.

The magnetic induction is 0.1971 Tesla which is only slightly less than the magnetic induction of 0.2059 Tesla in the arrangement of FIG. 7 and table 1. The disturbance coefficients, however, have become considerably smaller with l=5 and l=6 and m=+/−4. This is due to the reduced length of the edges of the square prisms or the smaller grid constants of the square line grid a on which the axes of the square prisms are disposed and the fact that axial positions of the square prisms are considerably closer to each other such that the surface of the radially inner part of the magnet arrangement is less rugged.

Figure 9:
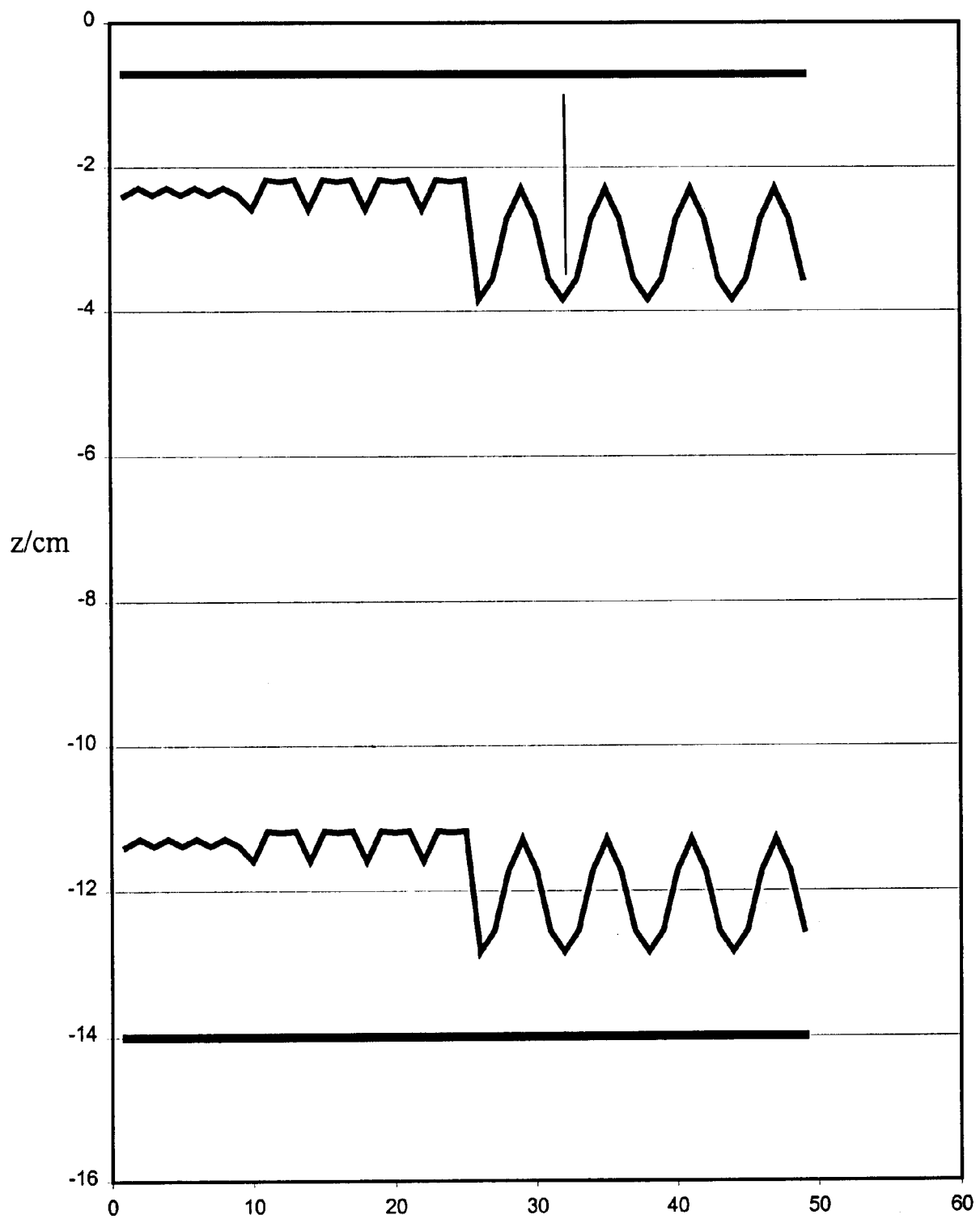
FIG. 9 shows the calculated axial positions of the surfaces facing the working volume and facing away from the working volume, of the different components of a further special embodiment of an inventive magnet arrangement.

Analogously to FIGS. 7 and 8, the diagram of FIG. 9 shows the axial positions of the components of a very similar magnet arrangement which differs from the magnet arrangement of FIG. 8 only in that the square prisms with the same edge lengths as in FIG. 8 (1.343 cm) are disposed on the same line grid as the prisms of FIG. 7, with a grid constant of 1.5428 cm. The cross-sectional fraction vqi of the square prisms of the radially inner part of the magnet arrangement is only 0.7577 instead of 1 as in the two above examples. FIG. 9 shows that the separation of the surfaces, facing the working volume, of the square prisms in the radially inner part from the center of the homogeneous volume is surprisingly reduced from 2.72 cm to 2.18 cm, wherein the homogeneity largely remains. This magnet arrangement therefore offers considerably less space for receiving gradient coils and RF coils without offering advantages, i.e. is considerably worse than the arrangements of the above examples. The characteristic relative geometric number vzi of this arrangement has been reduced from 0.504 to vzi=0.404. The other characteristic relative geometric numbers remain unchanged. The parameters of the magnetic induction in the working volume are combined in table 3.

| l/m | 0 | +/−1 | +/−2 | +/−3 | +/−4 | +/−5 | +/−6 |
|---|---|---|---|---|---|---|---|
| 0 | 1977. | — | — | — | — | — | — |
| 1 | 0 | 0 | — | — | — | — | — |
| 2 | 0 | 0 | 0 | — | — | — | — |
| 3 | 0 | 0 | 0 | 0 | — | — | — |
| 4 | 0 | 0 | 0 | 0 | 0 | — | — |
| 5 | −1.63 | 0 | 0 | 0 | −0.00018 | 0 | — |
| 6 | 1.42 | 0 | 0 | 0 | 0.0000186 | 0 | 0 |

Table 3: real parts of the coefficients $C_{l,m}$ of the expansion according to shperical harmonic functions of the magnetic induction of a magnet arrangement with the radial dimensions rii=5.4 cm, ri=5.4 cm, ra=10.6 cm, with vqi=0.7577 and the axial dimensions stated in FIG. 9, with a homogeneous remanence polarization of 13000 Gauss in Gauss/cm$^l$ (10000 Gauss=1 Tesla). The imaginary parts of the coefficients vanish identically. The azimuthal angle φ which is used implicitly for calculating the coefficients is measured from a surface diagonal of the square arrangement.

Instead of the square prisms, a similar magnet arrangement with a relatively unfavorable geometrical shape would be produced by disposing cylinders, with a diameter which is sufficiently large that they contact each other, at the same line grid. In this case, the reason therefor is also that the cross-sectional fraction of the cylinders of the radially inner part of such a (non-inventive) magnet arrangement is relatively small (vqi=π/4=0.785). For actual physical arrangements with cylinders instead of square prisms, the cross-sectional fraction of the magnetic material of the radially inner part tends to be smaller than 0.7, thereby considerably reducing the available space in the depression of the magnet arrangement.

I claim:

1. A main field magnet arrangement for a one-sided magnetic resonance device, said magnet arrangement generating a homogeneous magnetic field B in a working volume, the working volume and the main field magnet being disposed on different sides of a plane E, the main field magnet having a geometrical shape which permits positioning of a radio frequency (RF) receiver coil system and optionally a gradient coil system on a same side of the plane E as the main field magnet, the main field magnet arrangement comprising:

a radially outer group of outer field generating elements made from permanent magnetic material magnetized in a same sense as a direction of the magnetic field B in the working volume; and a radially inner group of inner field generating elements made from permanent magnetic material magnetized in said same sense as said direction of the magnetic field B in the working volume, said radially inner group surrounded by said radially outer group, said radially inner group having an inner surface facing the working volume which is axially further separated from a center of the working volume than an outer surface of said radically outer group, facing the working volume thereby forming an inner depression in an axial direction in said radially inner group, said inner field generating elements formed of parallel mutually adjacent inner prismatic rods, said inner prismatic rods having axes defining a grid of lines having a grid constant a, wherein individual surfaces of said inner prismatic rods have differing axial separations from the center of the working volume which deviate from a rotationally symmetric distribution about an axis A extending through the center of the working volume, said grid of lines extending through at least four grid constants in each of two principal directions.

2. The magnet arrangement of claim 1, wherein the main field magnet is part of one of a magnetic resonance tomography system and a magnet resonance tomography system for examining the skin.

3. The magnet arrangement of claim 1, wherein said prismatic rods have identical polygonal cross-sections.

4. The magnet arrangement of claim 1, wherein said prismatic rods have one of rectangular and square cross-sections.

5. The magnet arrangement of claim 1, wherein said prismatic rods have one of triangular cross-sections and equilateral triangular cross-sections.

6. The magnet arrangement of claim 1, wherein said prismatic rods have one of cross-sections of hexagonal shape and cross-sections of equilateral hexagonal shape.

7. The magnet arrangement of claim 1, wherein groups of prismatic rods are identical.

8. The magnet arrangement of claim 7, wherein all prismatic rods are identical.

9. The magnet arrangement of claim 1, wherein said outer field generating elements are formed from parallel, adjacent prismatic rods.

10. The magnet arrangement of claim 1, wherein said the radially outer group of outer field-generating elements is formed as a ring having square outer and inner ring cross-section.

11. The magnet arrangement of claim 10, wherein said radially outer group of outer field-generating elements are mutually integral with another.

12. The magnet arrangement of claim 1, wherein a cross-sectional fraction vqi filled with permanent magnetic material of an overall cross-sectional surface of said radially inner group of inner field-generating elements is at least 0.65.

13. The magnet arrangement of claim 1, wherein the radially inner group of inner field-generating elements is radially separated from said radially outer group.

14. The magnet arrangement of claim 13, further comprising a non-magnetic filler disposed in a radial region between said radially inner group and said radially outer group.

15. The magnet arrangement of claim 1, wherein a number of prismatic rods of inner field-generating elements in said radially inner group is between 37 and 81.

16. The magnet arrangement of claim 15, wherein said number of prismatic rods is between 45 and 49.

17. The magnet arrangement of claim 1, wherein a quotient vzi of an axial separation of surfaces, facing the working volume, of said radially inner group of inner field-generating elements from the center of the working volume to a radial separation ri of said axis A extending through the center of the working volume from a nearest radial inner border of said radially outer group of outer field-generating elements is at least 0.4.

18. The magnet arrangement of claim 1, wherein a quotient vza of axial separations between surfaces, facing the working volume, of said radially outer group of outer field-generating elements and the center of the working volume to a radial separation ri between said axis A extending through the center of the working volume and a nearest radial inner border of said radially outer part of said outer field generating elements is between 0.05 and 0.3.

19. The magnet arrangement of claim 1, wherein a quotient vra of a radial separation ra between said axis A extending through the center of the working volume and a nearest radially outer border of said radially outer group of said outer field-generating elements to a radial separation ri between said axis A and a nearest radially inner border of said radially outer group of outer field-generating elements is between 1.5 and 2.5.

20. The magnet arrangement of claim 1, wherein a quotient vl of an axial length L of said axis A to a radial separation ri between said axis A extending through the center of the working volume and a nearest radial inner border of said radially outer group of said outer field-generating elements is between 1.5 and 3.

21. The magnet arrangement of claim 1, wherein at least part of said prismatic rods of permanent magnetic material of said radially inner group of said inner field-generating elements is joined into one unit with said radially outer group.

22. The magnet arrangement of claim 21, further comprising non-magnetic filler disposed in a region between said inner and outer groups.

23. The magnet arrangement of claim 1, wherein at least part of said prismatic rods of permanent magnetic material of said radially inner group of inner field-generating elements can be moved in an axial direction, wherein said rods can be adjusted and fixed in their axial position.

24. The magnet arrangement of claim 23, further comprising means for adjusting said axial position of said rods, said adjusting means disposed on a side of the magnet arrangement facing away from the working volume.

25. The magnet arrangement of claim 1, further comprising one of a magnetic field mirror and a mirror plate of soft-magnetic material disposed on a side of the magnet arrangement facing away from the working volume.

26. The magnet arrangement of claim 1, wherein said prismatic rods of the magnet arrangement are formed of a permanent magnetic material of high magnetic hardness, wherein a magnetization M(H) in a magnetized state is reduced by less than 20% compared to a saturation magnetization $M_r$ in response to application of a demagnetizing magnetic field H up to a strength at which induction in said magnetic material vanishes.

27. The magnet of claim 26, wherein said permanent-magnetic material contains a NdFeB alloy.

28. A method for producing the magnet arrangement of claim 1, wherein said prismatic rods are produced by compression molding, sintering and precision grinding.

29. A method for producing the magnet arrangement of claim 9, wherein said prismatic rods of said radially outer group of the magnet arrangement are glued in parallel.

* * * * *